(12) United States Patent
Ito

(10) Patent No.: US 6,858,508 B2
(45) Date of Patent: Feb. 22, 2005

(54) SOI ANNEALING METHOD

(75) Inventor: Masataka Ito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 10/441,055

(22) Filed: May 20, 2003

(65) Prior Publication Data
US 2003/0203657 A1 Oct. 30, 2003

Related U.S. Application Data

(62) Division of application No. 09/963,448, filed on Sep. 27, 2001, now Pat. No. 6,613,638.

(30) Foreign Application Priority Data

Sep. 29, 2000 (JP) ........................ 2000/299222

(51) Int. Cl.[7] .......................................... H01L 21/8222
(52) U.S. Cl. ...................... 438/311; 438/540; 438/913; 438/935
(58) Field of Search ................. 438/311, 471, 438/540, 913, 935, 955

(56) References Cited

U.S. PATENT DOCUMENTS

| | | | |
|---|---|---|---|
| 5,371,037 A | 12/1994 | Yonehara | 437/86 |
| 5,374,564 A | 12/1994 | Bruel | 437/24 |
| 5,773,355 A | 6/1998 | Inoue et al. | 438/459 |
| 5,856,229 A | 1/1999 | Sakaguchi et al. | 438/406 |
| 5,863,830 A | 1/1999 | Bruel et al. | 438/478 |
| 5,869,387 A | 2/1999 | Sato et al. | 438/459 |
| 5,930,643 A * | 7/1999 | Sadana et al. | 438/407 |
| 6,171,982 B1 | 1/2001 | Sato | 438/795 |
| 6,238,990 B1 | 5/2001 | Aga et al. | 438/308 |
| 2002/0058387 A1 | 5/2002 | Ito | 438/308 |
| 2002/0061631 A1 | 5/2002 | Miyabayashi et al. | 438/478 |

FOREIGN PATENT DOCUMENTS

| | | | |
|---|---|---|---|
| EP | 0 926 707 | 6/1999 | |
| EP | 0 926 713 | 6/1999 | |
| JP | 58112323 | * 11/1981 | ......... H01L/21/263 |
| JP | 5-217821 | 8/1993 | |
| JP | 7-302889 | 11/1995 | |
| JP | 2608351 | 5/1997 | |
| JP | 11-145020 | 5/1999 | |
| JP | 2000-91233 | 3/2000 | |

OTHER PUBLICATIONS

D.K. Sadana et al., "Nano–Defects in Commercial Bonded SOI and SIMOX," *Proceedings 1994 IEEE International SOI Conference*, pp. 111–112 (1994).

* cited by examiner

*Primary Examiner*—Thanh Nguyen
(74) *Attorney, Agent, or Firm*—Fitzpatrick, Cella, Harper & Scinto

(57) ABSTRACT

A method for annealing an SOI in which two annealing steps are followed by a cooling step. During the second annealing step, the annealing temperature is from 993° C. to the melting point of silicon. During the cooling step, the cooling rate is not less than 0.12° C./sec when a temperature is from 993° C. to 775° C.

6 Claims, 6 Drawing Sheets

- 21 FIRST SUBSTRATE
- 24 SEMICONDUCTOR LAYER
- 23 SEPARATION LAYER
- 22 SUBSTRATE

- 22
- 23
- 24
- 25 INSULATING LAYER
- 26 SECOND SUBSTRATE

- 22
- 23A RESIDUAL SEPARATION LAYER
- 23B RESIDUAL SEPARATION LAYER
- 24
- 25
- 26

- 24
- 25
- 26

SOI ANNEALING METHOD

This application is a division of application Ser. No. 09/963,448, filed on Sep. 27, 2001, now U.S. Pat. No. 6,613,638 which is incorporated herein by reference.

BACKGROUND OF THE INVENTION

1. Field of the Invention

The present invention relates to a method of annealing an SOI (Semiconductor On Insulator) having a crystal semiconductor layer on an insulating layer and an SOI manufacturing method.

2. Background of the Invention

A technique of obtaining a highly planar surface by annealing an SOI in a reducing atmosphere is disclosed in, e.g., Japanese Patent Laid-Open No. 05-217821 by Sato et al. According to this document annealing at, for example, 1,000° C. in hydrogen gas yields such a highly planar surface, that the roughness on an SOI layer surface observed with an atomic force microscope is 2 nm or less. In addition, annealing with hydrogen to make the surface planar, as opposed to polishing, does not physically damage the surface.

Another advantage of this technique is in its high productivity that can be obtained by executing batch processing using a multi-wafer-treating annealing apparatus such as a vertical diffusion furnace generally used for a semiconductor process.

A method of annealing an SOI wafer in a reducing atmosphere is described in Japanese Patent Laid-Open No. 11-145020, where in an SOI wafer annealing method of annealing an SOI wafer at a temperature of 1,100° C. to 1,300° C. for 1 to 60 sec using a rapid heating/cooling apparatus, COP (Crystal Originated Particles) in the SOI wafer are eliminated by hydrogen annealing.

Although the number of HF defects in an SOI has decreased in recent years, the defects have not been completely eliminated. HF defects are supposed to cause an operation error in an SOI device, and the defect density is required to be lower. HF defects are unique to an SOI and are generated by dipping an SOI in hydrofluoric acid, as described in Sanada et al, "NANO-DEFECTS IN COMMERCIAL BONDED SOI AND SIMOX", Proceedings 1994 IEEE International SOI Conference, October 1994.

Probable causes for HF detects are metal contamination, pinholes in an SOI layer, and COPs in an SOI layer. For HF defects based on metal contamination, only an expensive measure which requires a costly investment for plant and equipment to minimize the metal contamination has been examined. No radical measure based on the examination of a relationship between metal contamination and HF defects has been taken.

SUMMARY OF THE INVENTION

It is an object of the present invention to provide an SOI annealing method and SOI manufacturing method which can reduce the HF defect density in an SOI.

It is another object of the present invention to provide an SOI annealing method and SOI manufacturing method which can reduce the number of HF defects caused by metal contamination at a relatively low cost.

According to an aspect of the present invention, there is provided an SOI annealing method characterized by comprising a step of annealing an SOI at a temperature between 993° C. (inclusive) and a melting point of silicon (inclusive) and the cooling step of reducing a temperature of the SOI after the annealing step, wherein in the cooling step, a cooling rate within a temperature range from 993° C. to 775° C. is not less than 0.12° C./sec.

According to another aspect of the present invention, there is provided an SOI annealing method characterized by comprising the first annealing step of annealing an SOI, the second annealing step of, after the first annealing step, annealing the SOI at a temperature between 993° C. (inclusive) and a melting point of silicon (inclusive), and the cooling step of reducing a temperature of the SOI after the second annealing step, wherein in the cooling step, a cooling rate within a temperature range from 993° C. to 775° C. is not less than 0.12° C./sec.

According to still another aspect of the present invention, there is provided an SOI annealing method characterized by comprising the step of annealing an SOI at a temperature between a melting point of a semiconductor metal compound formed from a metal and a semiconductor material of a crystal semiconductor layer of the SOI (inclusive) and a melting point of the semiconductor material (inclusive), and the cooling step of reducing a temperature of the SOI after the annealing step, wherein in the cooling step, a cooling rate within a temperature range from the melting point of the semiconductor metal compound and a production temperature of the semiconductor metal compound is not less than 0.12° C./sec.

According to still another aspect of the present invention, there is provided an SOI annealing method characterized by comprising the first annealing step of annealing an SOI, the second annealing step of, after the first annealing step, annealing the SOI at a temperature between a melting point of a semiconductor metal compound formed from a metal and a semiconductor material of a crystal semiconductor layer of the SOI (inclusive) and a melting point of the semiconductor material (inclusive), and the cooling step of reducing a temperature of the SOI after the second annealing step, wherein in the cooling step, a cooling rate within a temperature range from the melting point of the semiconductor metal compound and a production temperature of the semiconductor metal compound is not less than 0.12° C./sec.

As will be described below in detail, the present inventor found that the cause of HF defects based on metal contamination was a compound of the semiconductor material of an SOI layer and a metal contaminant, and that the number of HF defects which are formed as the compound was produced and then removed could be decreased by suppressing production of the compound.

According to the present invention, even when the crystal semiconductor layer of an SOI is contaminated by a metal, the produced semiconductor metal compound can be temporarily melted by annealing the SOI at a temperature equal to or higher than the melting point of the semiconductor metal compound formed from a metal and the semiconductor material of the crystal semiconductor layer.

In cooling the SOI from the melting point to the semiconductor metal compound production temperature, production of the semiconductor metal compound during the cooling step can be suppressed by reducing the temperature at a rate with a predetermined value or more.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

An outline of an SOI annealing method according to the present invention will be described with reference to FIG. 1.

An SOI which has a crystal semiconductor layer (SOI layer) on an insulating substrate (a substrate having an insulating layer on its surface or a substrate made of an insulating material) is prepared.

Figure 1:
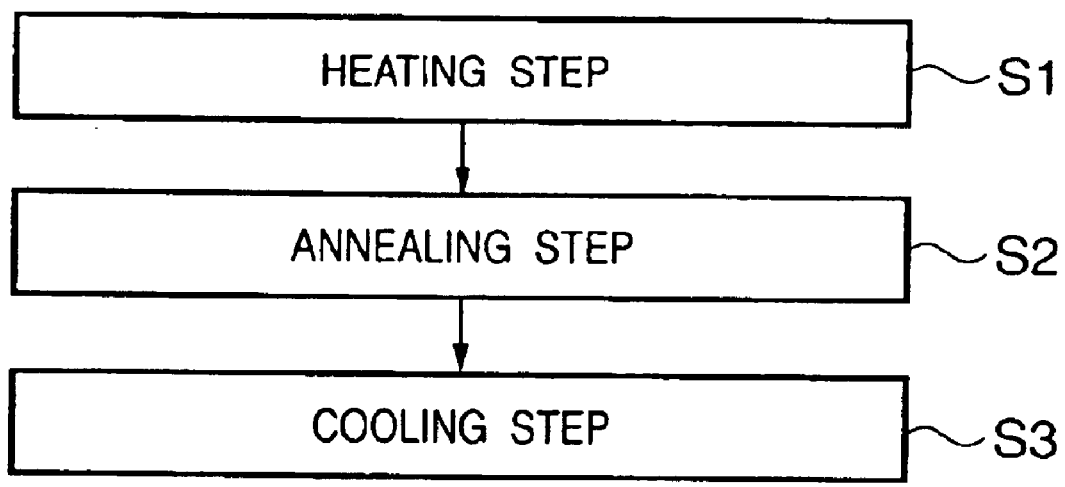
FIG. 1 is a flow chart of an annealing method according to the present invention.

As shown in FIG. 1, in heating step S1, the SOI is set in an annealing apparatus, and the heater of the annealing apparatus is activated to heat the SOI to a predetermined annealing temperature.

In annealing step S2, the SOI is annealed at the predetermined temperature for a predetermined time. The annealing temperature at this time is set to be equal to or higher than the melting point of a semiconductor metal compound of the semiconductor material of the crystal semiconductor layer and a metal, thereby temporarily melting the produced semiconductor metal compound.

In cooling step S3, the SOI is cooled at a rate with a predetermined value or more so that the SOI is cooled to a temperature appropriate for the next process while suppressing production of the semiconductor metal compound during the cooling step. When the cooling rate is set at 0.12° C./sec or more within the range from the melting point of the semiconductor metal compound to the production temperature of the semiconductor metal compound, production of the semiconductor metal compound that causes HF defects can be suppressed. When the cooling rate is set at 3° C./sec or more and, more preferably, at 6° C./sec or more, HF defects based on metal contamination can be reliably prevented.

As an SOI to be processed by the present invention, an SOI wafer having a crystal semiconductor layer formed on a handle substrate such as a silicon substrate via an insulating layer or an SOI wafer having a crystal semiconductor layer formed on an insulating substrate such as a silica glass substrate directly or via an insulating layer is used.

As a crystal semiconductor layer, a single-crystal semiconductor such as silicon or silicon germanium that contains silicon as a major component is preferably used. Especially, an epitaxially grown single-crystal semiconductor layer containing no COPs is more preferably used because HF defects due to COPs can be eliminated.

An SOI may be an intermediate product or a finished product formed by a SIMOX or bonding method. Especially, the present invention can be preferably applied to an SOI obtained by forming a porous layer on a donor wafer, epitaxially growing a non-porous single-crystal semiconductor layer on the porous layer, bonding the resultant structure to a handle wafer, and then separating the bonded substrate stack at the porous layer, or an SOI obtained by implanting ions of hydrogen or the like into a donor wafer, bonding the donor wafer to a handle wafer, and then separating the bonded substrate stack at a relatively heavily ion-implanted layer.

The present invention can be especially preferably applied to bonding methods described in Japanese Patent Application No. 2608351, U.S. Pat. No. 5,371,037, Japanese Patent Laid-Open No. 7-302889, and U.S. Pat. No. 5,856,229, i.e., SOI wafer manufacturing methods in which a porous layer is formed on a first substrate (donor wafer), a non-porous epitaxial layer is formed on the porous layer, the resultant structure is bonded to a second substrate (handle wafer), unnecessary portions including the porous layer are removed, and then the surface of the SOI layer is planarized.

Metal contamination here mainly means metal contamination observed in intermediate products which are not completed yet as SOI wafers to be shipped as merchandise. Not many completed high-quality SOI wafers have serious metal contamination.

According to analysis by the present inventors, no serious metal contamination is observed in a completed SOI wafer obtained by the above-described SOI wafer manufacturing method using a porous layer. The metal contamination level in an intermediate product by this method is much lower than metal contamination that poses a problem in a normal semiconductor manufacturing process. The metal contamination concentration on an SOI wafer surface is as low as, e.g., about $1\times10^9$ atoms/cm$^2$ to $2\times10^9$ atoms/cm$^2$. The present invention can be very effectively applied to remove HF defects due to such low-level metal contamination.

The atmosphere used for annealing and cooling in the present invention contains at least one gas selected from rare gases such as helium, neon, and argon, inert gases such as nitrogen, and hydrogen gas. To suppress defects by an oxygen impurity or to achieve high surface planarity, a reducing atmosphere containing hydrogen is more preferably used.

The annealing temperature falls within the range between the melting point of a semiconductor metal compound and the melting point of the semiconductor of the SOI. To reduce HF defects due to nickel contamination, the annealing temperature is preferably set to be equal to or more than 993° C. The upper limit is preferably set at 1,300° C. or less.

Examples of a semiconductor metal compound are metal silicides such as nickel silicide, manganese silicide, and iron silicide. Examples of a metal that causes metal contamination are transition metals such as nickel, manganese, and iron.

For nickel, the nickel concentration on an SOI surface before annealing can be $1\times10^9$ atoms/cm$^2$ or more. Alternatively, annealing may be executed under an environment wherein the nickel concentration on an SOI surface increases to $1\times10^9$ atoms/cm$^2$ or more by annealing.

The "nickel concentration on an SOI wafer surface" is obtained by recovering metal impurities present on the wafer surface into a liquid such as pure water or an acid solution, measuring the metal concentration of each element in the liquid using an ICP-MS (Inductively Coupled Plasma Mass Spectroscopy) apparatus or the like, and converting a measured value to the number of metal atoms per wafer unit area. If the obtained nickel concentration is $1\times10^9$ atoms/cm$^2$ or more, conspicuous HF defects may be generated.

Hence, the present invention has a special effect for an SOI with metal contamination at such a concentration.

The production temperature of nickel silicide is 775° C., the eutectic temperature of nickel silicide is 966° C., and the melting point of nickel silicide is 993° C. In this case, the cooling rate within the range from 993° C. to 775° C. is set at 0.12° C./sec or more and, preferably, at 3° C./sec or more, and more preferably, at 6° C./sec or more.

The "cooling rate" within the temperature range from 993° C. to 775° C." means the absolute value of a differential value obtained by differentiating the wafer temperature at a certain temperature within the range from 993° C. to 775° C. by time.

Iron silicide has a production temperature of 550° C., a eutectic temperature of 1,208° C., and a melting point of 1,212° C. to 1,220° C. Manganese silicide has a production temperature of 800° C., and a eutectic temperature of 1,150° C. Hence, when not only nickel but also manganese cause serious metal contamination, the cooling rate within the range from 1,150° C. to 800° C. is set at 0.12° C./sec or more and, preferably, at 3° C./sec or more, and more preferably, at 6° C./sec or more. When not only nickel but also iron (and manganese) cause serious metal contamination, the cooling rate within the range from 1,220° C. to 550° C. is set at 0.12° C./sec or more and, preferably, at 3° C./sec or more, and more preferably, at 6° C./sec or more.

Figure 2:
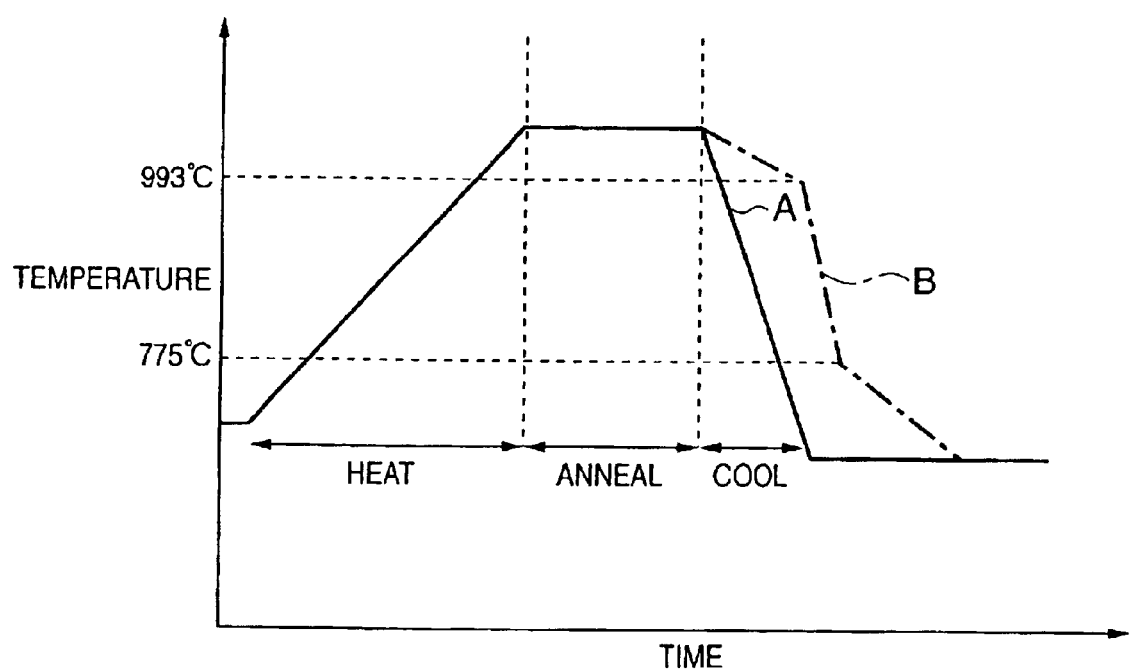
FIG. 2 is a graph for explaining the cooling rate in the cooling step according to the present invention.

FIG. 2 is a graph schematically showing a change in temperature used in the present invention.

In the present invention, in the cooling step after heating and annealing, the slope representing the cooling rate within the temperature range from 993° C. to 775° C. is at 0.12° C./sec or more and, preferably, at 3° C./sec or more, and more preferably, at 6° C./sec or more, as indicated by a solid line A and an alternate long and short dashed line B in FIG. 2.

(First Embodiment)

Figure 3:
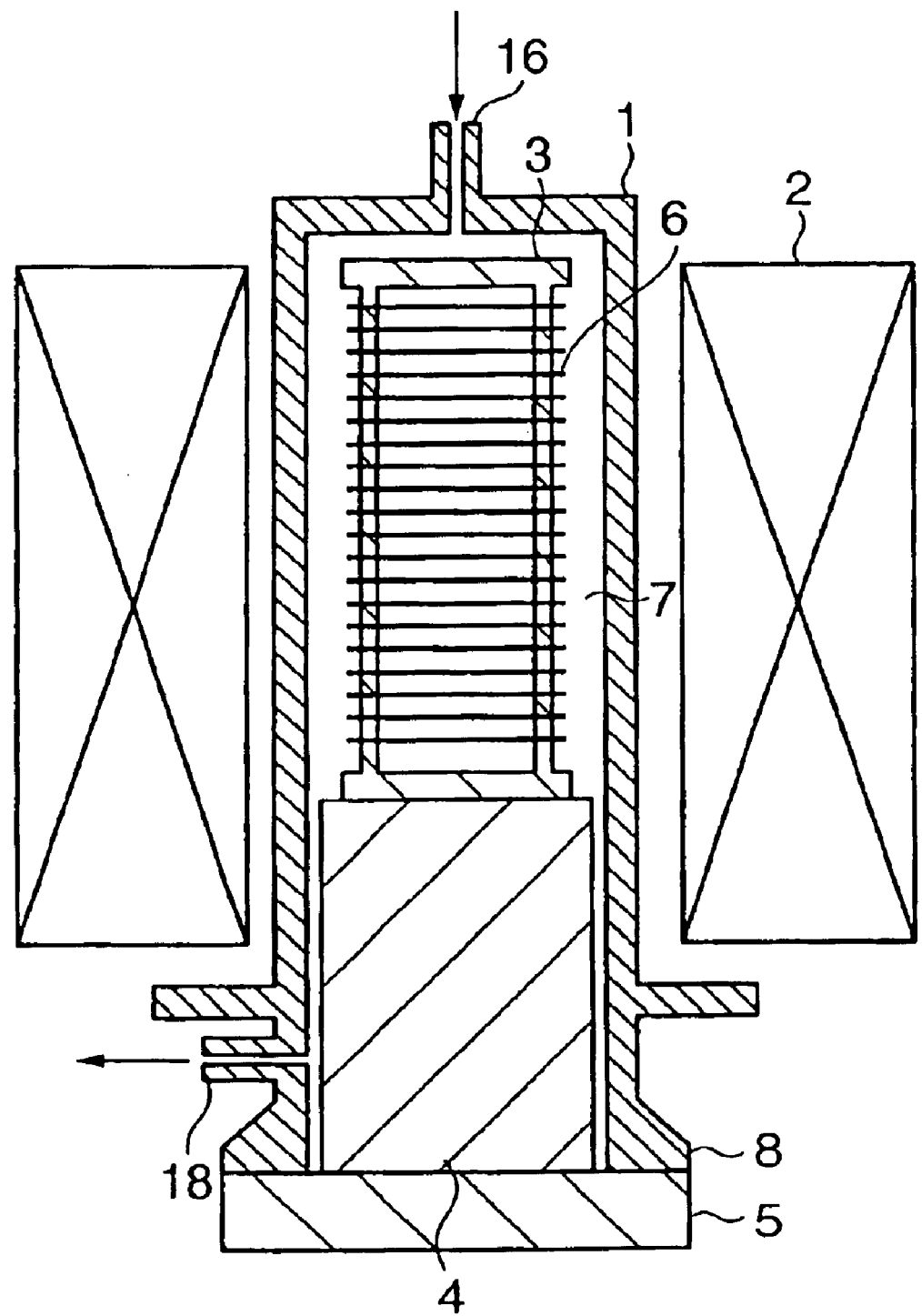
FIG. 3 is a schematic longitudinal sectional view of an annealing apparatus used in the present invention.

FIG. 3 is a longitudinal sectional view showing the schematic arrangement of an annealing apparatus used in the present invention.

Referring to FIG. 3, reference numeral 1 denotes a process chamber. The annealing chamber 1 is designed to supply an annealing atmospheric gas from a supply port 16 provided at the upper portion of a furnace tube formed from silica glass or the like and exhaust the gas from an exhaust port 18 at the lower portion. Reference numeral 2 denotes a heater such as an induction heater; and 3, a holding means for holding objects 6 to be processed, which are placed on a heat barrier 4 arranged on a furnace lid 5. This holding means is a boat made of, e.g., silicon carbide and can hold a plurality of objects 6 such as SOI wafers to be processed. As the material of the boat 3, silicon carbide manufactured by sintering is used. The boat 3 may have a coating of silicon carbide that is chemically synthesized by chemical vapor phase deposition on a surface of a silicon carbide body or base manufactured by sintering. Although not illustrated, a load/unload chamber for the objects to be processed is arranged on the lower side of the furnace tube so that the objects to be processed can be loaded or unloaded by moving the furnace lid 5 downward.

As the apparatus shown in FIG. 3, for example, a rapid heating/cooling furnace FTPS (registered trademark) available from Tokyo Electron can be used.

The above-described annealing method of the present invention can be practiced in accordance with the following procedure using the apparatus shown in FIG. 3. The furnace lid 5 is moved downward in advance. The plurality of SOI wafers 6 as objects to be processed are set in the boat 3. The furnace lid 5 is moved to the position shown in FIG. 3 to place the SOI wafers 6 in a process chamber 7 and close an opening portion 8 of the furnace tube 1. The furnace lid 5 is operated by an elevating mechanism (not shown). The interior of the process chamber 7 is pre-heated to, e.g., about 600° C., i.e., a temperature lower than the actual annealing temperature. To prevent oxidation of the surfaces of the SOI wafers, an inert gas such as nitrogen is preferably supplied into the processing space 7, as needed, to set an inert gas atmosphere.

Subsequently, an atmospheric gas is supplied from the supply port 16 to the processing space 7 to replace the atmosphere in the process chamber 1 with a process atmosphere. The atmospheric gas to be supplied contains at least one gas selected from rare gases such as helium, neon, and argon, and inert gases such as nitrogen, and hydrogen gas. When a reducing atmosphere containing hydrogen is used as the process atmosphere, the surface planarization effect or crystal defect reduction effect in the SOI layer can be obtained by so-called hydrogen annealing.

Next, the processing space 7 is heated to a predetermined processing temperature by the heater 2, thereby heating the SOI wafers 6 to a temperature higher than 993° C., e.g., 1,100° C. In the present invention, the heating rate is not particularly limited. In such an apparatus, if the temperature in the process chamber 1 is 993° C. or more, it can be regarded that the temperature of the substrates is also 993° C. or more.

After the elapse of time, e.g., 1 min or more necessary for annealing, the power supply to the heater 2 is reduced to lower the temperature of the SOI wafers to a predetermined pre-heat temperature (e.g., 600° C.) lower than 775° C.

At this time, the temperature change (cooling rate) is set at 0.12° C./sec or more and, preferably, at 3° C./sec or more, and more preferably, at 6° C./sec or more within the temperature range from 993° C. to 775° C. It is also preferable that the temperature is lowered at a first cooling rate within the temperature range from 993° C. to 775° C., then, the temperature is lowered at a second cooling rate slower than the first cooling rate. During the cooling, it is preferable that the reducing gas is continuously supplied into the processing space 7.

After the predetermined pre-heat temperature is obtained, the atmosphere in the process chamber 1 is replaced as needed. After that, the furnace lid 5 is moved downward, and the SOI wafers 6 are extracted from the boat or together with the boat.

When HF defects in the resultant SOI wafers are checked, the number of HF defects is smaller than that in a conventional case wherein the cooling rate is set at 0.05° C./sec to 0.08° C./sec (about 3° C./min to 5° C./min).

The relationship between HF defects and metal contamination will be described in detail. When SOI wafers were annealed in a reducing atmosphere at a high temperature using the multi-wafer-treating annealing apparatus shown in FIG. 3, the number of HF defects in SOI layers sometimes increased.

The present inventor extensively studied the increased HF defects and found that an increase in number of HF defects was related to metal contamination by, e.g., nickel that was produced in a very small amount in wafers by annealing. That is, when the surface or interior of an SOI layer is contaminated by a metal during annealing, a crystallite of deposit (semiconductor metal compound) is produced as the metal bonds to silicon in the cooling process. This compound is removed by hydrofluoric acid and appears as HF defects.

It is often more difficult to reduce metal contamination in a reducing atmosphere than in an oxidizing atmosphere. A probable source of metal contamination is the annealing apparatus. To reduce the metal contamination, the annealing apparatus may be improved. However, since members used in a multi-wafer-treating annealing apparatus become large and complex in accordance with the number of wafers to be processed, it is economically and technically difficult to make all members using very pure materials, and it is also hard to manage a very low metal contamination concentration. For example, a boat, i.e., a holding member used to simultaneously process 100 or more SOI wafers is as long as 1 m or more and has 400 or more grooves to hold wafers. If the boat is manufactured using a material with a high purity, the cost becomes high, and management such as inspection and exchange/cleaning operations is not easy.

According to the above-described embodiment, even for an SOI wafer for which the nickel concentration on the SOT surface is $1 \times 10^9$ atoms/cm$^2$ or more or an SOI wafer for which the nickel concentration on the SOI surface increases to $1 \times 10^9$ atoms/cm$^2$ or more by annealing, HF defects due to metal contamination can be suppressed without using any expensive apparatus using materials with high purity.

(Second Embodiment)

When an object to be processed is moved downward from a process chamber at a high temperature to an load/unload chamber at room temperature at a high speed, the object can be rapidly cooled without using any heater capable of rapid cooling.

The procedure of the second embodiment of the present invention is as follows.

The annealing apparatus to be used and the procedure until annealing is executed at a predetermined temperature (e.g., 1,100° C.) for a predetermined time (e.g., 1 hr) are the same as in the first embodiment.

After annealing, the temperature of a heater 2 is controlled to set the temperature in a process chamber 1 at 993° C. Next, a furnace lid 5 is moved downward by an elevating mechanism (not shown). Since SOI wafers are unloaded from the process chamber at a high temperature to an external space (load/unload chamber) at room temperature, they are rapidly cooled so that a cooling rate of 0.12° C./sec or more and, preferably, 3° C./sec or more, and more preferably, 6° C./sec or more is attained within the temperature range from 993° C. to 775° C.

With this procedure, a crystallite deposit produced as a metal impurity in SOI wafers and bonded to silicon can be prevented, and the number of HF defects can be reduced.

The objects to be processed may be rapidly cooled by injecting cool air to the boat and/or the objects to be processed in the load/unload chamber as needed.

(Third Embodiment)

The third embodiment of the present invention will be described.

Figure 4:
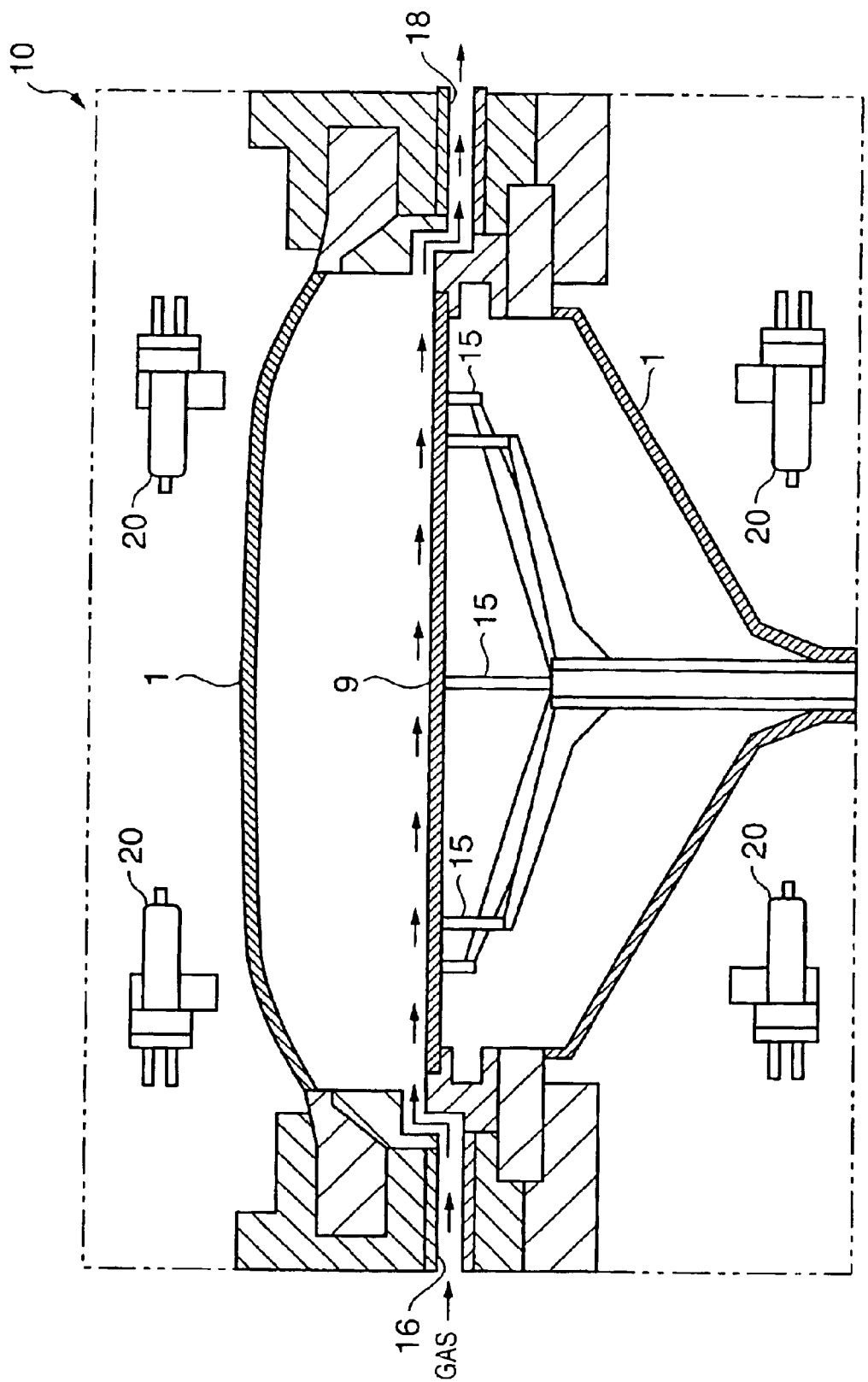
FIG. 4 is a schematic longitudinal sectional view of a single-wafer-treating annealing apparatus used in the present invention.

FIG. 4 is a schematic view showing an annealing apparatus used in the present invention.

The apparatus shown in FIG. 4 is a single-wafer-treating annealing apparatus for processing objects (not shown) such as SOI wafers to be processed one by one. The annealing apparatus has a process chamber 1 having upper and lower walls formed from silica glass and a susceptor 9 arranged in the process chamber 1 to support an object to be processed. A supply port 16 for supplying a process gas is formed in the side portion of the process chamber 1. An exhaust port 18 is formed at an opposing position. A plurality of halogen lamps 20 serving as a heating means are radially laid out in the upper and lower regions of the process chamber 1.

An object (not shown) to be processed is placed on the susceptor 9, and then, the halogen lamps 20 are turned on to heat the object to be processed from the upper and lower sides. Simultaneously, an atmospheric gas is supplied from the supply port 16 while exhausting the gas from the exhaust port 18. The atmospheric gas flows as a laminar flow along the surface of the object to be processed, which is heated to a predetermined temperature, so that annealing is executed.

This apparatus has the same arrangement as that of an epitaxial growing apparatus described in Japanese Patent Laid-Open No. 2000-091233.

The process chamber 1 whose main portions are formed from silica glass rarely absorbs light emitted from the halogen lamps 20. For this reason, the temperature of the process chamber rises little, and only the SOI wafer as the object to be processed and the susceptor 9 reach a high temperature. Since the susceptor 9 only need to have a flat shape and be thick enough to support one SOI wafer, the volume of the susceptor 9 is very small, and therefore, the heat capacity is also small. Hence, when the output of the halogen lamps 20 is decreased after the elapse of a predetermined annealing time, the susceptor 9 and SOI wafer are quickly cooled. Using this fact, the amount of current to be supplied to the halogen lamps is controlled using a control circuit of PID scheme, thereby realizing a cooling rate of 0.12° C./sec or more and, preferably, 3° C./sec or more, and more preferably, 6° C. /sec or more within the temperature range from 993° C. to 775° C.

The procedure of the annealing method using the apparatus shown in FIG. 4 is as follows.

A gate valve (not shown) is opened, and an SOI wafer is placed on lift pins 15 projecting from the susceptor 9. The lift pins 15 are moved downward to place the SOI wafer on the susceptor 9. The gate valve is closed, and the gas is exhausted from the exhaust port 18.

An atmospheric gas is supplied from the supply port 16. After the process chamber is filled with the atmospheric gas, the halogen lamps 20 is powered on to rapidly heat the SOI wafer to a predetermined temperature.

The SOI wafer is heated to a temperature equal to or higher than 993° C., e.g., 1,100° C. and annealed. The atmospheric gas to be supplied contains at least one gas selected from rare gases such as helium, neon, and argon, and inert gases such as nitrogen, and hydrogen gas. When a reducing atmosphere containing hydrogen is used, the surface planarization effect or crystal defect reduction effect in the SOI layer can be obtained by so-called hydrogen annealing.

After the elapse of time necessary for annealing, power supply to the halogen lamps 20 is stopped, and the temperature of the SOI wafer is rapidly lowered to a temperature lower than 775° C.

The temperature change (cooling rate) at this time is set at 0.12° C./sec or more and, preferably, at 3° C./sec or more, and more preferably, at 6° C./sec or more within the temperature range from 993° C. to 775° C.

After a temperature necessary for unloading is obtained, the atmosphere in the process chamber is replaced as needed, the process chamber is opened, the lift pins 15 are moved upward to separate the SOI wafer from the susceptor 9, and the SOI wafer is unloaded from the process chamber.

(Fourth Embodiment)

In the multi-water-treating annealing apparatus as shown in FIG. 3, it is difficult to reduce metal contamination in a slightest amount. To do this, a single-wafer-treating annealing apparatus can be used. In many single-wafer-treating annealing apparatuses, a member which may cause contamination, e.g., a holding means called a susceptor for holding an object to be processed, has a size equal to or slightly larger than the size of the object to be processed and a simple shape because of its structural design. Hence, a member with high purity can easily be used, and management such as inspection/exchange/cleaning operations is also relatively easy. In addition, an arrangement for preventing contamination by preventing an increase in temperature of the members of the process chamber can be easily attained, and even when contamination occurs from the members of the process chamber, a gas flow for preventing the contamination from reaching the object to be processed can be easily attained.

However, the productivity of the single-wafer-treating annealing apparatus is low. For example, a time required to execute annealing of 1 hr for 100 objects to be processed using a multi-wafer-treating annealing apparatus is about 4 hrs including the object transfer time and heating/cooling time. However, when a single-wafer-treating annealing apparatus is used, a time of 100 hrs is required even excluding the transfer time and heating/cooling time. Hence, from the viewpoint of productivity, a multi-wafer-treating annealing apparatus cannot simply be replaced with a single-wafer-treating annealing apparatus.

Figure 5:
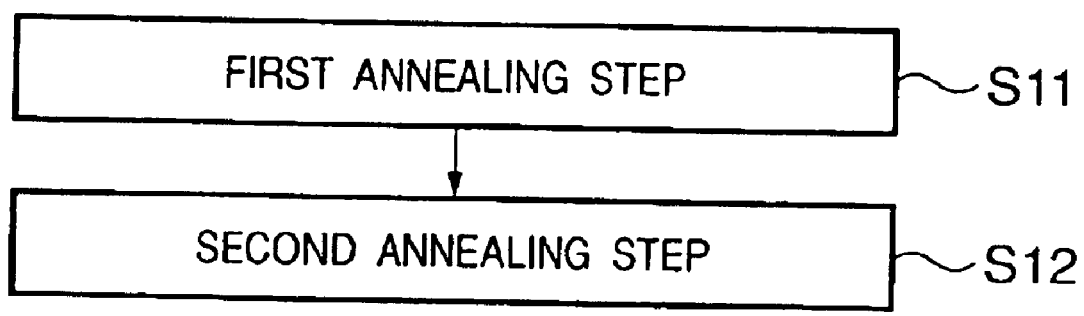
FIG. 5 is a flow chart of another annealing method according to the present invention.

In this embodiment, annealing is executed in accordance with the procedure shown in FIG. 5.

In the first annealing step S11 of this embodiment, the vertical annealing apparatus shown in FIG. 3 is used.

A furnace lid 5 is moved downward in advance. SOI wafers 6 are set in a boat 3. The furnace lid 5 is moved to the position shown in FIG. 3 to place the SOI wafers 6 in a process chamber and close the opening portion of the furnace tube.

The furnace lid 5 is operated by an elevating mechanism (not shown). The interior of a process chamber 1 is pre-heated to, e.g., about 600° C. To prevent oxidation of the SOI surfaces, a nitrogen atmosphere is set in the process chamber 1. Subsequently, a hydrogen gas is supplied from a supply port 16 into the furnace tube to replace the atmosphere in the process chamber 1 with a hydrogen gas atmosphere.

The interior of the process chamber 1 is heated to a predetermined temperature by a heater 2 to increase the temperature in the process chamber to a predetermined temperature (e.g., 1,100° C.), thereby annealing the SOI wafers.

After the elapse of a predetermined time (e.g., 1 hr) in which a desired hydrogen annealing effect can be obtained, the temperature of the heater 2 is reduced to a predetermined pre-heat temperature (e.g., 600° C.). The temperature change (cooling rate) is normally controlled within the range of 3° C. to 7° C. per min. After the predetermined pre-heat temperature is obtained, nitrogen gas is supplied into the process chamber to replace the atmosphere. Then, the furnace lid 5 is moved downward, and the SOI wafers are unloaded.

Second annealing step S12 is executed for the SOI wafers. In the second annealing step S12, the apparatus shown in FIG. 4 is used. An SOI wafer (not shown) is placed on a susceptor 9, and then, halogen lamps 20 are turned on to heat the SOI wafer. Simultaneously, an atmospheric gas is supplied from a supply port 16 while exhausting the gas from an exhaust port 18. The atmospheric gas flows as a laminar flow along the surface of the SOI wafer heated to a predetermined temperature so that annealing is executed.

The same gas as in the above-described embodiment can be used as the atmospheric gas.

As a process temperature, a temperature between the melting point of a semiconductor metal compound, e.g., 993° C. and the melting point of silicon is used. Since the annealing effects for the SOI wafer, e.g., outward diffusion of an impurity such as boron and surface planarization have been obtained in the first annealing step S11, the process time in the second annealing step S12 is preferably made as short as possible from the viewpoint of productivity. A short time of, e.g., 3 mm suffices.

When the output of the halogen lamps 20 is decreased after the elapse of a predetermined annealing time, the susceptor 9 and SOI wafer are quickly cooled. Hence a cooling rate of 0.12° C./sec or more and, preferably, 3° C./sec or more, and more preferably, 6° C./sec or more within the temperature range from 993° C. to 775° C. can be attained.

With this processing, a crystallite deposit can be prevented from being produced as a metal impurity in the SOI wafer bonded to silicon, and the number of HF defects can be decreased. After being cooled to a predetermined unload temperature, the SOI wafer is removed from the susceptor 9 and the annealing is ended.

As the apparatus used in the second annealing step, not the above-described lamp heating scheme but an induction heating scheme may be used.

The first and second annealing steps need not always be continuously executed, and another step may be inserted between them.

The temperatures and times in the first and second annealing steps are determined by the state of an object to be processed and the degree of the desired effect. For the total annealing time required, when the first annealing time is set to be long, and the second annealing time is set to be short, a number of SOI wafers can be annealed in a relatively short time.

For example, when 100 SOI wafers are to be annealed for 3 hrs using the apparatus shown in FIG. 4, a time of 300 hrs is required even excluding the wafer transfer time and time required for heating/cooling.

To the contrary, when annealing as the first annealing step is executed for 2 hrs 57 min using the apparatus shown in FIG. 3, and the second annealing step is executed for 3 min using the apparatus shown in FIG. 4, the time required to execute the first annealing step for the 100 SOI wafers is about 8 hrs even including the transfer time and heating/cooling time, and the time required for the second annealing step is 6 min per wafer, i.e., annealing time of 3 min + time (3 min) required to transfer and heat/cool one wafer. The time required to process 100 wafers is 600 min (10 hrs).

The sum of the times required for the first and second annealing steps is 18 hrs. The process time can be shortened to about $\frac{1}{16}$ of that using only the apparatus shown in FIG. 4.

(Fifth Embodiment)

An SOI manufacturing method according to an embodiment of the present invention will be described with reference to FIGS. 6A to 6D.

Figure 6A:
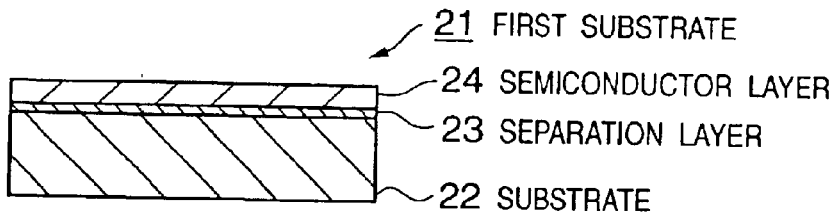
FIGS. 6A to 6D are views for explaining an SOI manufacturing method according to the present invention.

As shown in FIG. 6A, a first substrate 21 having a separation layer 23 inside is prepared.

This substrate is manufactured in the following way.

First method: A substrate 22 such as a single-crystal silicon wafer is prepared, and a porous layer serving as the separation layer 23 is formed by anodizing the substrate surface. This porous layer is formed from a plurality of layers having different porosities, as needed. If necessary, after the inner surfaces of pores in the porous layer are oxidized, annealing is executed in a reducing atmosphere containing hydrogen and/or a reducing atmosphere containing a trace amount of a source gas, thereby sealing pores on the surface of the porous layer. A non-porous single-crystal semiconductor layer 24 is formed on the porous layer. Thus, the first substrate 21 is obtained.

Second method: A substrate 22 such as a single-crystal silicon wafer is prepared, an insulating layer is formed on the substrate surface as needed, and ions of a rare gas such as helium, neon, or argon, nitrogen ions, or hydrogen ions are implanted such that a peak concentration is formed near a depth where a separation layer 23 is to be formed. In this way, a layer in which the implanted particles have a peak concentration at a predetermined depth in the substrate 22 can be obtained. Since microbubbles, defects, or distortion is locally generated near the peak concentration, the mechanical strength locally degrades, and this layer acts as the separation layer 23 in the separation process later. The surface portion of the substrate 22 on the separation layer 23 is a semiconductor layer 24. Thus, the first substrate 21 is obtained.

Figure 6B:
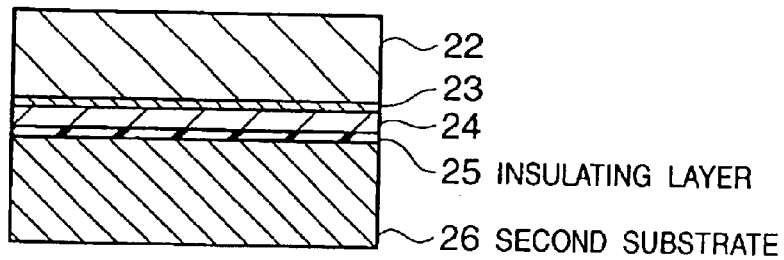

As shown in FIG. 6B, a second substrate 26 such as a silicon wafer or silica glass wafer different from the first substrate 21 is prepared and bonded to the first substrate 21. At this time, at least one of the substrates has an insulating surface. In the example shown in FIG. 6B, an insulating layer 25 is formed on a surface of at least one of the first substrate 21 and second substrate 26, and the substrates are bonded.

Figure 6C:
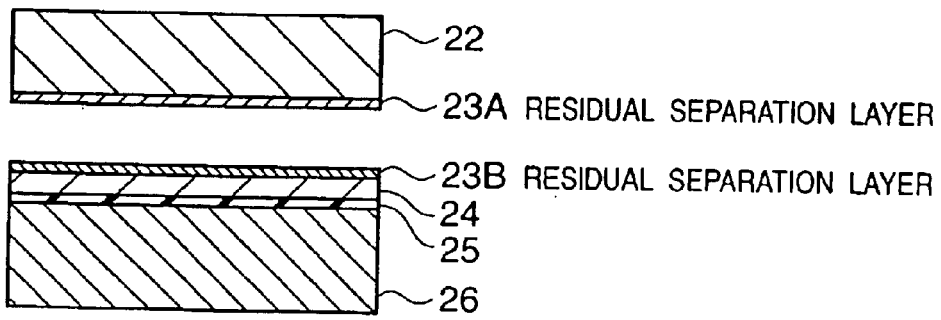

As shown in FIG. 6C, an external force is applied to the first and second substrates 21 and 26 to separate them at the separation layer 23. In the separation layer 23 and at its upper and lower interfaces, since the mechanical strength is low, or stress concentrates, a crack is formed in the separation layer 23 or at its upper and lower interfaces by the separating force. To apply an external force, the bonded substrate stack is simply pulled, a jet of a fluid is injected to the side surface of the bonded substrate stack, a hydrostatic pressure is applied using a fluid, or a solid wedge is inserted into the side surface of the bonded substrate stack. Alternatively, the separation layer 23 may be irradiated with light, or the bonded substrate stack may be heated to generate a force in the separation layer. These methods may be combined to separate the bonded substrate stack.

Figure 6D:
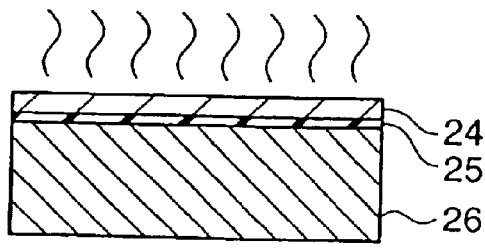

A non-porous semiconductor layer is transferred to the second substrate 26. When a residual separation layer 23B remaining on the surface (separation surface) is relatively thick, the residual separation layer is removed as needed to planarize the surface, thereby forming an SOI as shown in FIG. 6D.

The annealing method of the present invention is preferably used for an SOI immediately after separation, an SOI after the residual separation layer is removed, or an SOI after surface planarization by polishing is executed. Detailed examples of the annealing method are the same as in the above-described first to fifth embodiments. Especially, it is more preferable to execute the above-described annealing after the residual separation layer is wet-etched or to execute the above-described annealing after the bonded substrate stack is separated at the separation layer by ion implantation.

After that, fabrication processing for the edge of the SOI layer or cleaning processing for removing various kinds of contamination is performed, thereby obtaining an SOI as a finished product.

When a residual porous layer 23A remains on the substrate 22 of the separated first substrate, the substrate can be used again as the substrate 22 shown in FIG. 6A by removing the residual porous layer as needed.

The present invention can be also applied to a 200 nm or less thick semiconductor layer formed on an insulating layer. The semiconductor layer may be a single layer made of Si, Ge, SiGe, SiC, C, GaAs, GaN, AlGaAs, InP, or InAs, or multiple layers thereof. For example, an Si layer is formed on an SiGe layer, or an SiGe layer is formed on an Si layer. The above crystal semiconductor layer may be formed from a plurality of semiconductor layers having the same composition but different impurity concentrations or different resistivity values (e.g., a semiconductor layer formed from a silicon layer having the first resistivity value and a silicon layer formed on that silicon layer and having the second resistivity value different from the first resistivity value).

EXAMPLE

An example of the present invention will be described below.

A plurality of SOI wafers each having a 100-nm thick SOI layer and a 100-nm thick buried layer were prepared.

The SOI wafers were loaded into the annealing apparatus shown in FIG. 2, and annealing was executed in a 100% hydrogen gas atmosphere at 1,050° C. for 3 hrs as the first annealing step.

After the end of annealing, the power supply to the heater was reduced to lower the temperature of the SOI wafers from 1,050° C. to 600° C. In this cooling step, the cooling rate within the temperature range from 993° C. to 775° C. was 0.11° C./sec, i.e., lower than 0.12° C./sec.

The plurality of SOI wafers were unloaded from the apparatus shown in FIG. 2, and one of them was loaded to the apparatus shown in FIG. 3. This SOI wafer was rapidly heated to 1,100° C. in a 100% hydrogen gas atmosphere to execute the second annealing step. When 3 min elapsed after the temperature increased to 1,100° C., the lamps are turned off to rapidly cool the SOI wafer. At this time, the cooling rate within the temperature range from 993° C. to 775° C. was 6° C./sec.

The SOI wafer as a comparative example that underwent only the first annealing and the SOI wafer of this example, which underwent the first and second annealing processes, were dipped in hydrofluoric acid for 15 min. Then each SOI wafer was observed in its predetermined range with an optical microscope. The number of HF defects was counted, and the number of measured HF defects was divided by the observation area, thereby obtaining an HF defect density. The results are shown in Table 1.

TABLE 1

|  | Example | Comparative example |
| --- | --- | --- |
| HF defect density | 0.04 defects/cm$^2$ | 0.22 defects/cm$^2$ |

According to this example, the HF defect density on the SOI wafer could be reduced to about ⅕ that of the comparative example, and the HF defect density could be reduced to 0.05 defects/cm$^2$ or less.

According to the present invention, an SOI with a low HF defect density can be provided.

As many apparently widely different embodiments of the present invention can be made without departing from the spirit and scope thereof, it is to be understood that the invention is not limited to the specific embodiments thereof except as defined in the appended claims.

What is claimed is:

1. An SOI annealing method comprising:
   a first step of annealing an SOI in a reducing atmosphere containing hydrogen;
   a second step of annealing the SOI at a temperature from 993° C. to a melting point of silicon; and
   a cooling step of reducing a temperature of the SOI after the second annealing step at a cooling rate that is not less than 0.12°C./sec when a temperature is from 993° C. to 775° C.

2. The method according to claim 1, wherein a process temperature in the first annealing step is from 775° C. to the melting point of silicon.

3. The method according to claim 1, wherein a process temperature in the first annealing step is from 996° C. to the melting point of silicon.

4. The method according to claim 1, wherein a process temperature in the first annealing step is from 993°C. to the melting point of silicon.

5. The method according to claim 1, wherein an annealing time in the first annealing step is greater than that in the second annealing step.

6. An SOI manufacturing method comprising the steps of:
   manufacturing an SOI by forming a crystal semiconductor layer on an insulating substrate; and
   annealing the SOI by the method according to claim 1.

* * * * *